(12) United States Patent
Okui

(10) Patent No.: US 6,326,823 B1
(45) Date of Patent: Dec. 4, 2001

(54) CLOCK CONTROL CIRCUIT

(75) Inventor: Yutaka Okui, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/541,428

(22) Filed: Apr. 3, 2000

(30) Foreign Application Priority Data

Aug. 10, 1999 (JP) .................................................. 11-225976

(51) Int. Cl.[7] ....................................................... H03L 7/00
(52) U.S. Cl. ......................... 327/160; 327/142; 327/291; 327/166; 365/233
(58) Field of Search ..................................... 327/141, 160, 327/142, 291, 293, 295, 296, 297, 166, 299, 48; 377/47, 48; 365/189.04, 189.07, 233; 375/354, 355

(56) References Cited

U.S. PATENT DOCUMENTS 4,970,418 * 11/1990 Masterson ............................. 327/141
5,524,035 * 6/1996 Casal et al. ............................. 377/47

FOREIGN PATENT DOCUMENTS 4-302014   10/1992 (JP) .

* cited by examiner

Primary Examiner—Timothy P. Callahan
Assistant Examiner—Minh Nguyen
(74) Attorney, Agent, or Firm—Volentine Francos, PLLC

(57) ABSTRACT

A simplified clock control circuit in which noise and consumed electric power is reduced. When an output signal of a first flip-flop becomes "H" by input of a starting signal, an output signal of a first gate becomes "H", and a master clock signal given to a second gate is output as a clock signal. The clock signal is counted by a counter, and when the count value becomes a first set value, a trigger signal for starting another clock control portion is output from a first comparator. When the count value becomes a second set value, an operation end signal is output from a second comparator, an output signal of a second flip-flop becomes "L", and the output signal of the first gate becomes "L", to stop output of the clock signal.

19 Claims, 4 Drawing Sheets

CLOCK CONTROL CIRCUIT

BACKGROUND OF THE INVENTION

1. Field of the Invention

The present invention relates to a clock control circuit for controlling a clock signal supplied to a plurality of functional blocks operating in accordance with a specific sequence.

2. Description of the Related Art

As a conventional technique in such a field, there has been, for example, one disclosed in the following publication: Japanese Patent Application Laid-open No. Hei. 4-302014.

FIG. 2 is a circuit diagram of a logic circuit driving device including a conventional clock control circuit disclosed in the above publication. However, for convenience of explanation, reference characters different from those of the above publication are used.

This logic circuit driving device is composed of a plurality of functional blocks 20a, 20b, and a sequence controller (that is, a clock control circuit) 30 for sequentially supplying a clock signal to these functional blocks.

Each of the functional blocks 20a, 20b, has the same structure, and for example, the functional block 20a includes a flip-flop (hereinafter referred to as a "FF") 21 to which an operation information signal SAa is given. The operation information signal SAa is given to a clock terminal C of the FF 21, and a data terminal D of this FF 21 is fixedly connected with a level "H". A reset terminal R of the FF 21 is connected with an output side of a two-input NOT-OR gate (hereinafter referred to as a "NOR") 22, and a system reset signal RST is given to a first input side of the NOR 22.

A status signal STa is outputted from an output terminal Q of the FF 21, and this output terminal Q is connected with a first input side of a two-input logical product gate (hereinafter referred to as an "AND") 31 in the sequence controller 30 and a data terminal D of an FF 32. A continuous system clock signal SCK is given to a second input side of the AND 31, and a clock signal CKa controlled by the status signal STa is outputted from an output side of the AND 31. The output side of the AND 31 is commonly connected with a clock terminal C of each of counters 23 and 24 in the functional block 20a and a clock terminal C of each of the FFs 32 and 33 in the sequence controller 30.

Each of the counters 23 and 24 is a counter with an initial set function to hold data given to input terminals D0 to D3 as an initial value when a signal of level "L" is given to a set terminal S. The set terminals S of the counters 23 and 24 are respectively connected to an output terminal Q of the FF 32. The counters 23 and 24 respectively have a function to output a signal of "L" to an output terminal C0 when its count value becomes "0". An inverter 25 is connected to the output terminal C0 of the counter 23, and a processing signal PRa is outputted from this inverter 25. The output terminal C0 of the counter 24 is connected with an input side of an inverter 26 and a clock terminal C of a FF 27, and an operation information signal SAb for the next stage functional block 20b is outputted from this inverter 26.

A data terminal D of the FF 27 is fixedly connected with a level "H", and its output terminal Q is connected to a first input side of a two-input logical sum gate (hereinafter referred to as an "OR") 28. The system reset signal RST is given to a second input side of the OR 28, and an output side of the OR 28 is connected to a reset terminal R of the counter 24.

An output side of the inverter 25 is connected to a data terminal D of the FF 33, and an output terminal Q of the FF 33 is connected to a second input side of the NOR 22.

Next, the operation will be described.

When the operation information signal SAa is given to the functional block 20a in the state where the system reset signal RST is released, the status signal STa outputted from the FF 21 becomes "H". By this, the gate of the AND 31 is opened, and the system clock signal SCK is supplied, as the clock signal CKa, to the clock terminal C of each of the counters 23 and 24, and the FFs 32 and 33.

At the first rising of the clock signal CKa, the output signal of the FF 32 becomes "H", and the respective counters 23 and 24 become a state where a count operation from an initial value given to the input terminals D0 to D3 is possible. At every rising of the clock signal CKa, the count value is sequentially renewed.

After a predetermined time has elapsed, when the count value of the counter 24 reaches "0" at the rising of the clock signal CKa, the signal of its output terminal C0 becomes "L", the operation information signal SAb outputted from the inverter 26 becomes "H", and the functional block 20b is started. Further, the count value of the counter 24 becomes "1" at the next rising of the clock signal CKa, the signal of the output terminal C0 becomes "H", and the operation information signal SAb becomes "L". By this, the output signal of the FF 27 becomes "H", and the counter 24 is reset through the OR 28.

Besides, when the count value of the counter 23 reaches "0" at the rising of the clock signal CKa, the signal of its output terminal C0 becomes "L", and the processing signal PRa outputted from the inverter 25 becomes "H". The output signal of the inverter 25 is given to the data terminal D of the FF 33. Thus, when the clock signal next rises, the output signal of the FF 33 becomes "H", and the count value of the counter 23 becomes "1", and the signal of its output terminal C0 becomes "H". By this, the processing signal PRa becomes "L".

When the output signal of the FF 33 becomes "H", all of the FFs 21, 27, 32, and 33 are reset through the OR 22, and the status signal STa becomes "L". By this, the gate of the AND 31 is closed, and the supply of the clock signal CKa to the functional block 20a is stopped.

As described above, in this logic circuit driving device, since each clock signal CKa, CKb, is supplied from the sequence controller 30 to each functional block 20a, 20b, only when the signal is required, it is possible to suppress noise and consumed electric power due to an unnecessary clock signal.

However, in the clock control circuit of the conventional logic circuit driving device, there has been a problem as set forth below.

That is, for the supply control of the clock signal CKa and the starting control of the next stage functional block 20b, the FFs 21, 27, 32, and 33, and the counters 23 and 24 with the initial set function have been used. Thus, the circuit scale becomes relatively large, and there has been a limit in the reduction of noise and the consumed electric current due to the operation of counters or the like.

SUMMARY OF THE INVENTION

The present invention has been made to solve the problem inherent in the conventional technique, and an object thereof is to provide a clock control circuit which can reduce noise and consumed electric power by simplifying a circuit scale.

In order to solve the foregoing problem, according to a first aspect of the invention, a clock control circuit includes a plurality of clock control portions which are provided correspondingly to a plurality of functional blocks performing a logical operation in accordance with a specific sequence on the basis of a master clock signal, and which supply a clock signal as a basis of the logical operation, and each of the clock control portions is structured as follows: the clock control portion comprises gate control means for outputting a gate signal when a starting signal is given from an outside or another clock control portion, and for stopping the output of the gate signal when an operation end signal is given; gate means for supplying the master clock signal as the clock signal to the corresponding functional block when the gate signal is given and for stopping supply of the clock signal when the gate signal is stopped; count means for counting the number of pulses of the clock signal outputted from the gate means and for outputting a count value; first detection means for outputting the operation end signal when detecting that the count value becomes a predetermined first set value; and second detection means for outputting the starting signal when detecting that the count value becomes a second set value lower than the first set value.

According to a second aspect of the invention, the count means of the first aspect is constructed of a counter that is reset when the gate signal is given, and counts the clock signal when the gate signal is released. Besides, the first detection means is constructed of a first register for setting the first set value, and a first comparator for outputting the operation end signal when the count value of the counter coincides with the value of the first register. Moreover, the second detection means is constructed of a second register for setting the second set value and a second comparator for outputting the starting signal when the count value of the counter coincides with the value of the second register.

According to the invention, since the clock control circuit is constructed as described above, the function as described below is carried out.

When a starting signal is given to the gate control means of the clock control portion, a gate signal is outputted from the gate control means to the gate means. When the gate signal is given to the gate means, the master clock signal is outputted through this gate means, and the supply of the clock signal to the corresponding functional block is started. The clock signal outputted from the gate means is counted by the count means such as a counter, and when the count value becomes, for example, the second set value set in the second register, the starting signal to another clock control portion is outputted from, for example, the second comparator of the second detection means. Further, when the count value becomes, for example, the first set value set in the first register, the operation end signal is outputted from, for example, the first comparator of the first detection means, and the gate signal outputted from the gate control means is stopped. By this, the supply of the clock signal to the functional block is stopped.

DETAILED DESCRIPTION OF THE PREFERRED EMBODIMENTS

Figure 1:
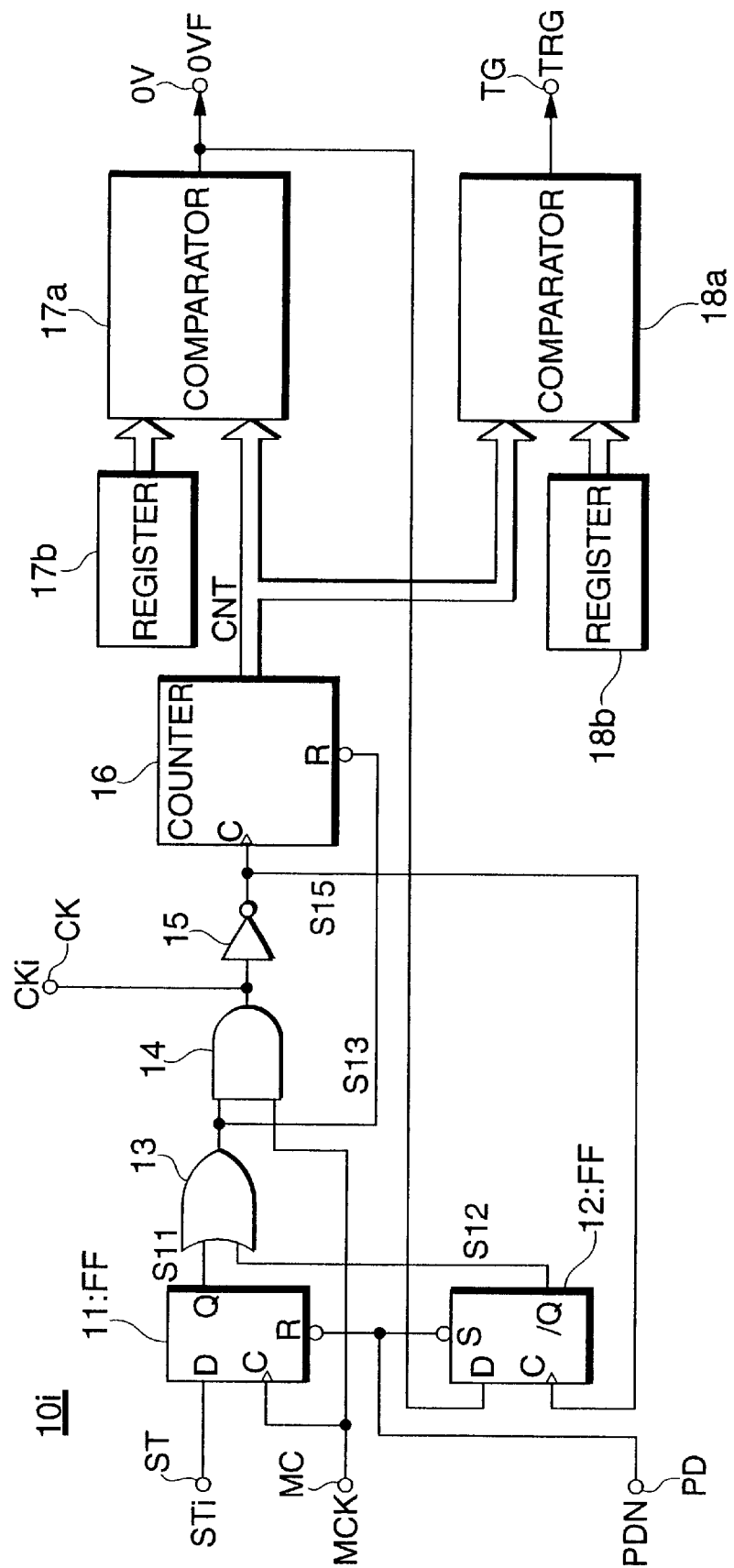
FIG. 1 is a circuit diagram of a clock control portion according to an embodiment of the invention.
Figure 2:
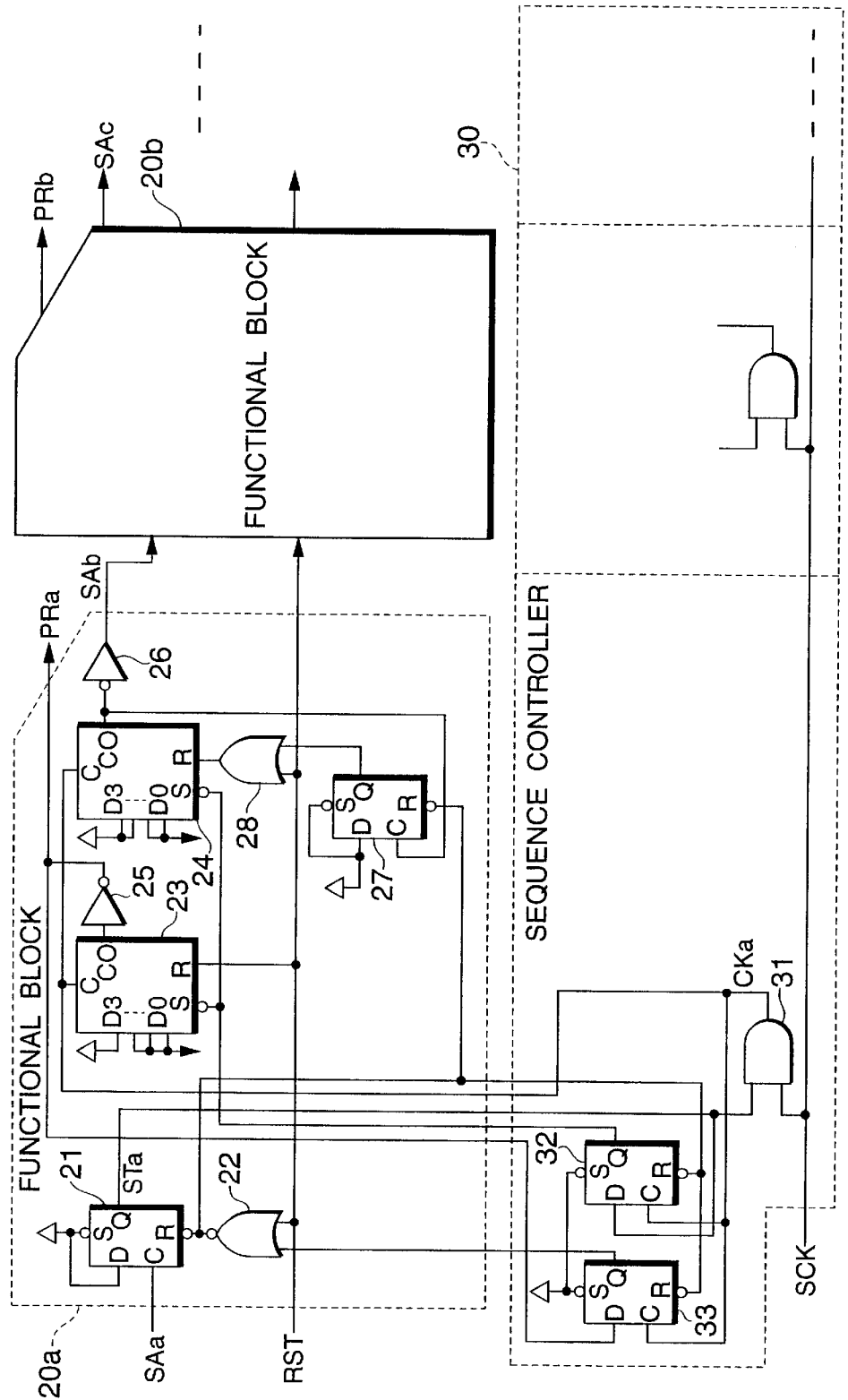
FIG. 2 is a circuit diagram of a conventional logic circuit driving device including a clock control circuit.

FIG. 1 is a circuit diagram of a clock control portion according to an embodiment of the invention.

A clock control portion 10*i* includes a terminal ST to which a starting signal STi is given, a terminal MC to which a master clock signal MCK is given, and a terminal PD to which a power-saving mode signal PDN is given. The terminals ST, MC and PD are connected to a data terminal D, a clock terminal C, and a reset terminal R of a FF 11 in a gate control arrangement (for example, FFs 11 and 12, and OR 13), respectively.

The terminal PD is also connected to a set terminal S of the FF 12, and an inverted output terminal /Q ("/" means inversion) of the FF 12 and an output terminal Q of the FF 11 are connected to input sides of the two-input OR 13. An output side of the OR 13 is connected to a first input side of a gate (for example, a two-input AND) 14, and a second input side of the AND 14 is connected to the terminal MC. An output side of the AND 14 is connected to a terminal CK for outputting a clock signal CKi, and is connected to an input side of an inverter 15.

An output side of the inverter 15 is connected to a clock terminal C of each of counter 16 and the FF 12. When a signal of "L" is given to a reset terminal R, the counter 16 forcibly sets a count value CNT to "0" and outputs, and when a signal of "H" is given, the counter counts up the count value CNT one by one at every rising of an output signal S15 of the inverter 15. An output side of the counter 16 is connected to a first input side of each of first and second detectors (for example, comparators) 17*a* and 18*a*. Registers 17*b* and 18*b* are connected to second input sides of the comparators 17*a* and 18*a*, respectively.

The comparator 17*a* compares the count value CNT of the counter 16 with a value set in the register 17*b*, and when these become coincident with each other, the comparator outputs an operation end signal OVF of "H". An output side of the comparator 17*a* is connected to a terminal OV and a data terminal D of the FF 12. The comparator 18*a* compares the count value CNT of the counter 16 with a value set in the register 18*b*, and when these become coincident with each other, the comparator outputs a starting signal (for example, a trigger signal) TRG of "H". An output side of the comparator 18*a* is connected to a terminal TG.

Figure 3:
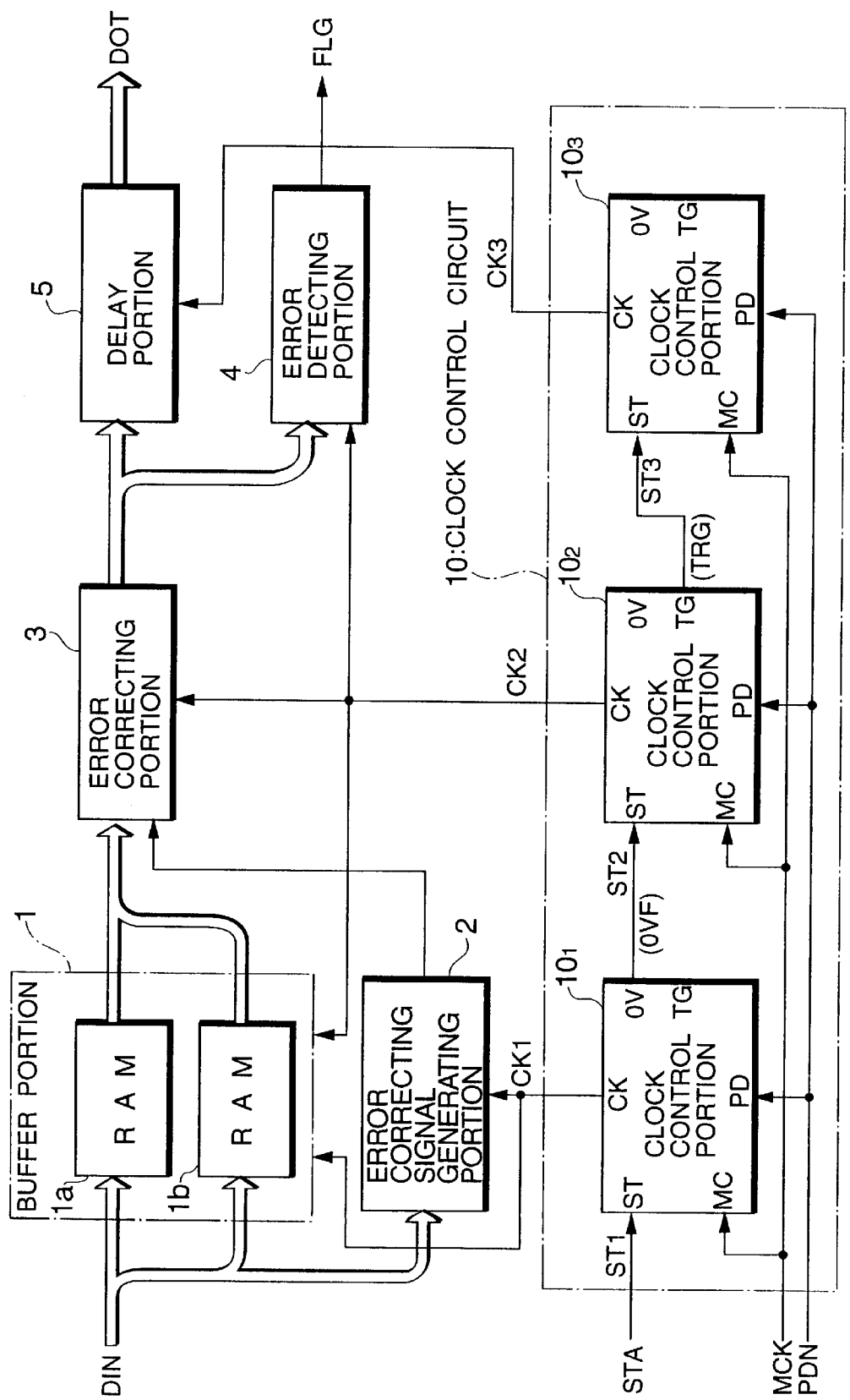
FIG. 3 is a structural view of an error correcting circuit including the clock control portion of FIG. 1.

FIG. 3 is a structural view of an error correcting circuit provided with the clock control portion of FIG. 1.

This error correcting circuit is composed of functional blocks of a buffer portion 1, an error correcting signal generating portion 2, an error correcting portion 3, an error detecting portion 4, and a delay portion 5, and a clock control circuit 10 for supplying a clock signal, as a basis of an operation, to these functional blocks.

Input data DIN of plural bits are given to the buffer portion 1 and the error correcting signal generating portion 2 in parallel. The buffer portion 1 is composed of two pairs of random access memories (hereinafter referred to as "RAM") 1*a* and 1*b*, a not-shown control circuit, and the like, and is structured such that while the input data DIN are written in one RAM (for example, the RAM 1*a*), data are read out from the other RAM 1*b*. The error correcting signal generating portion 2 extracts an error correcting signal in the input data DIN.

The error correcting portion 3 is connected to the output side of the buffer portion 1 and the error correcting signal generating portion 2. The error correcting portion 3 corrects the input data DIN read out from the buffer portion 1 by the error correcting signal outputted from the error correcting signal generating portion 2 and generates corrected data. The output side of the error correcting portion 3 is connected to the error detecting portion 4 and the delay portion 5.

The error detecting portion 4 checks the corrected data outputted from the error correcting portion 3 and judges whether the data are properly corrected, and when an error remains, the detecting portion outputs an error detection signal FLG. The delay portion 5 inserts a predetermined delay time so that the output timing of the corrected data coincides with the error detection signal FLG outputted from the error detecting portion 4 and the data are outputted as output data DOT of plural bits in parallel.

The buffer portion 1, the error correcting signal generating portion 2, the error correcting portion 3, the error detecting portion 4, and the delay portion 5 sequentially perform the operation to correct an error of the sequentially inputted input data DIN and to output the output data DOT, on the basis of clock signals CK1, CK2, and CK3 supplied from the clock control circuit 10.

The clock control circuit 10 is composed of three cascaded clock control portions $10_1$, $10_2$, and $10_3$. Each clock control portion $10i$ (i=1, 2, 3) has the same structure as that shown in FIG. 1.

The first stage clock control portion $10_1$ supplies the clock signal CK1 for write control to the buffer portion 1 and the error correcting signal generating portion 2. A start signal STA is given as a starting signal ST1 to a terminal ST of the clock control portion $10_1$ from the outside, and a terminal CK is connected to the buffer portion 1 and the error correcting signal generating portion 2. A terminal OV of the clock control portion $10_1$, is connected to a terminal ST of the next stage clock control portion $10_2$, and an operation end signal OVF outputted from this clock control portion $10_1$, is given as a starting signal ST2 to the clock control portion $10_2$.

The clock control portion 102 supplies the clock signal CK2 for read control of the buffer portion 1, and its terminal CK is connected to the buffer portion 1, the error correcting portion 3, and the error detecting portion 4. A terminal TG of the clock control portion $10_2$ is connected to a terminal ST of the clock control portion $10_3$, and a trigger signal TRG outputted from this clock control portion $10_2$ is given as a starting signal ST3 to the clock control portion $10_3$.

The final stage clock control portion $10_3$ supplies the clock signal CK3 for output of the output data DOT in synchronization with the error detection signal FLG, and its terminal CK is connected to the delay portion 5.

Figure 4:
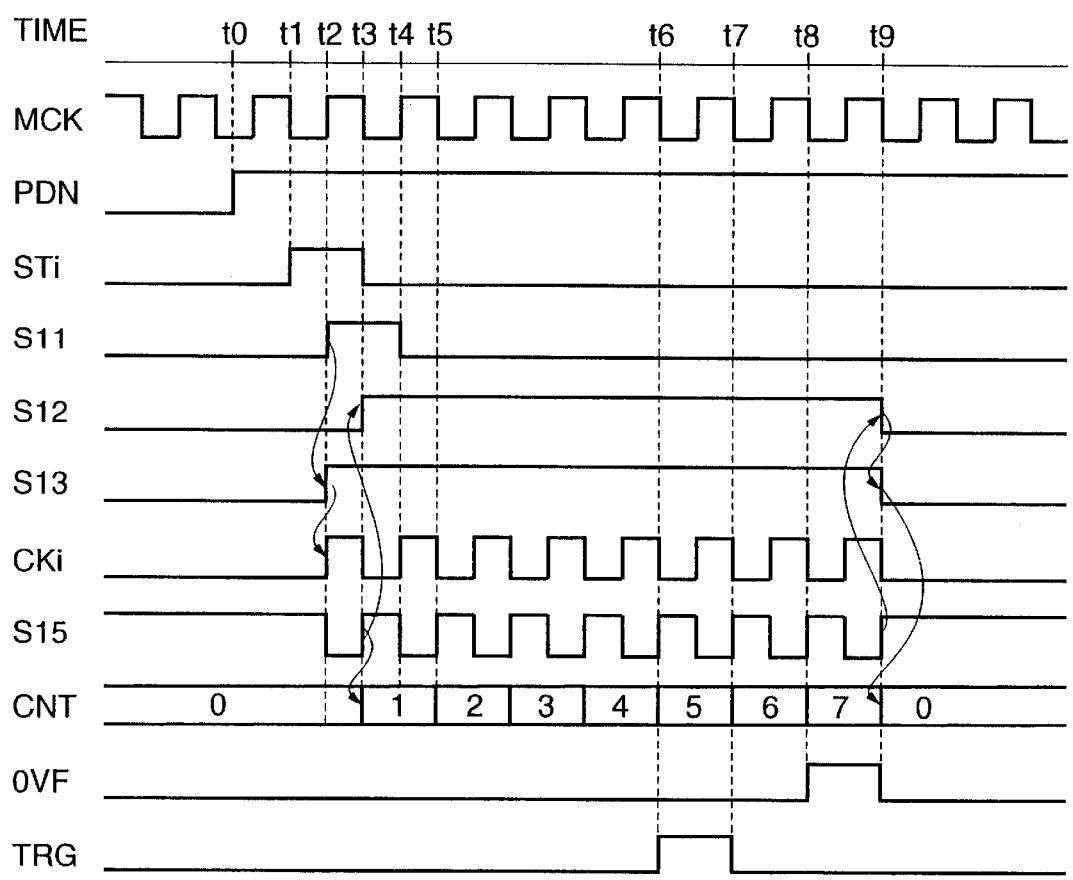
FIG. 4 is a time chart showing an example of the operation of FIG. 1.

FIG. 4 is a time chart showing an example of the operation of FIG. 1. Hereinafter, the operation of the error correcting circuit of FIG. 3 will be described with reference to FIGS. 1 and 4 and mainly as to the operation of the clock control portion $10_1$.

When the operation of the error correcting circuit of FIG. 3 is not necessary, the power-saving mode signal PDN given from the outside is "L". By this, the FF 11 in FIG. 1 is reset, the FF 12 is set, and both the output signals S11 and S12 are "L". Thus, the gate signal (for example, output signal) outputted from the OR 13 becomes "L", the gate of the AND 14 is closed, and the clock signal CK1 is not outputted to the terminal CK. The counter 16 is reset, and the count value CNT is "0".

At time t0 of FIG. 4, when the power-saving mode signal PDN is changed to "H" in order to enable the operation of the error correcting circuit, the FFs 11 and 12 are put in operable states. However, at this point of time, since the starting signal STA is "L", the output signal S11 of the FF 11 is "L", and the gate of the AND 14 remains closed. Thus, the output signal S12 of the FF 12 is also kept at "L".

The starting signal STA is switched to "H" in synchronization with the falling of the master clock signal MCK at time t1, and input of the input data DIN as an object of error correction is started.

When the master clock signal MCK rises at time t2, the output signal S11 of the FF 11 becomes "H", and the output signal S13 of the OR 13 becomes "H". By this, the reset state of the counter 16 is released, and the gate of the AND 14 is opened, so that output of the clock signal CK1 from the terminal CK is started. The clock signal CK1 is given to the buffer portion 1 and the error correcting signal generating portion 2, and writing of the input data DIN to the buffer portion 1 is carried out on the basis of the clock signal CK1.

The starting signal STA is switched to "L" in synchronization with the falling of the master clock signal MCK at time t3. At this time, since the output signal S15 of the inverter 15 is changed from "L" to "H", the output signal S12 of the FF 12 becomes "H", and the count value CNT of the counter 16 becomes "1".

When the master clock signal MCK rises at time t4, although the output signal S11 of the FF 11 becomes "L", since the output signal S12 of the FF 12 is "H", the output signal S13 of the OR 13 is kept in the state of "H". With this, the output of the clock signal CK1 from the terminal CK is being continued.

When the master clock signal falls at time t5, the count value CNT of the counter 16 is renewed to "2".

Similarly, the count value CNT of the counter 16 is sequentially incremented at every falling of the master clock signal MCK.

When the count value CNT of the counter 16 is renewed to, for example, "5" at falling of the master clock signal MCK at time t6 and coincides with the value set in the register 18b, the trigger signal TRG outputted from the comparator 18a becomes "H".

When the count value CNT of the counter 16 is renewed to, for example, "6" at falling of the master clock signal MCK at time t7, the trigger signal TRG outputted from the comparator 18a becomes "L".

When the count value CNT of the counter 16 is renewed to, for example, "7" at falling of the master clock signal MCK at time t8 and coincides with the value set in the register 17b, the operation end signal OVF outputted from the comparator 17a becomes "H". The operation end signal OVF is given to the data terminal D of the FF 12, and is outputted from the terminal OV as the starting signal ST2 to the next stage clock control portion $10_2$. By this, in the clock control portion $10_2$, the same operation as the clock control portion $10_1$ is started.

When the output signal S15 of the inverter 15 rises at time t9, since the data terminal D of the FF 12 is "H", the output signal S12 of this FF 12 is changed to "L". By this, the output signal S13 of the OR 13 is also changed to "L", and the counter 16 is reset, and further, the gate of the AND 14 is closed, and the output of the clock signal CK1 from the terminal CK is stopped.

On the other hand, the clock control portion $10_2$ is started by the starting signal ST2 given from the clock control portion $10_1$. In the clock control portion $10_2$, the same operation as the clock control portion $10_1$ is carried out, and the clock signal CK2 for read control, having a predetermined number of clocks, is supplied from the terminal CK to the buffer portion 1, the error correcting portion 3, and the error detecting portion 4. Further, the trigger signal TRG is outputted at predetermined timing from the terminal TG of the clock control portion $10_2$, and is given as the starting signal ST3 for starting the clock control portion $10_3$.

The clock control portion $10_3$ is started by the starting signal ST3 given from the clock control portion $10_2$, and the same operation as the clock control portion $10_1$ is carried out. By this, the clock signal CK3 for output of the output data DOT, having a predetermined number of clocks, is supplied from the terminal CK of the clock control portion $10_3$ to the delay portion 5.

As described above, the clock control portion of this embodiment has merits (1) and (2) as set forth below.

(1) The counter 16 for counting the clock signal CKi and two comparators 17a and 18a for comparing the count value CNT with the set value are provided. By this, as compared with a conventional circuit, it is possible to start a next stage clock control portion through a small circuit scale, and to output the clock signal CKi having a predetermined number of pulses, so that reduction in noise and consumed electric power can be made.

(2) Since the set values to the comparators 17a and 18a are set in the registers 17b and 18b, for example, even during the operation, arbitrary timing can be set.

The present invention is not limited to the foregoing embodiment, but various modifications are possible. As the modified examples, for example, the following modifications (a) to (e) can be enumerated.

(a) Although FIG. 3 shows the example in which the clock control portion 10i is applied to the error correcting circuit, it can be applied to any functional block in the same manner.

(b) Although the whole operation of the clock control circuit 10 is controlled by the power-saving mode signal PDN, a reset signal or the like may be used.

(c) In FIG. 1, although a positive logic circuit structure is adopted to clarify the operation explanation, a circuit structure using a negative logic or mixture of the positive logic and negative logic may be adopted.

(d) Like the clock control portion 10, in FIG. 3, in the case where the later stage clock control portion 10, is started at the point of time when the operation of the clock control portion 10, is ended, the comparator 18a and the resister 18b in FIG. 1 may be omitted.

(e) As shown in FIG. 1, although the first and second detectors are constructed of the comparators 17a and 17b and the resisters 17a and 18b so that an arbitrary value can be set, in the case where it is not necessary to change the set value, the detectors can be constructed of a logical gate such as AND. By this, the circuit structure can be further simplified.

As described above in detail, according to the first aspect of the invention, the clock control circuit includes a counter for counting clock signals supplied to the corresponding functional block, and first and second detectors for respectively detecting that the count value of the counter becomes the first or second set value. By this, there is an effect that it becomes possible to supply the clock signal to the respective functional blocks at arbitrary timing. Further, since the number of counters may be one, there are effects that the circuit structure is simplified, and it becomes possible to reduce noise and consumed electric power due to an unnecessary clock signal.

According to the second aspect of the invention, the counter is generally constructed of the counter, and the first and second detectors are constructed of the registers and comparators. By this, in addition to the same effects as the first aspect, there is an effect that timing can be freely changed and set, for example, even during the operation.

What is claimed is:

1. A clock control circuit comprising
a plurality of clock control portions which are provided correspondingly to a plurality of functional blocks, wherein the plurality of functional blocks each perform performing a logical operation in accordance with a specific sequence on the basis of a master clock signal, the clock control portions each supplying a clock signal as a basis of the logical operations, wherein each of the clock control portions comprises:
gate control means for outputting a gate signal when a starting signal is given from an outside or another clock control portion, and for stopping output of the gate signal when an operation end signal is given;
gate means, having the master clock signal input thereto, for supplying the clock signal to the corresponding functional block when the gate signal is given and for stopping supply of the clock signal when the gate signal is stopped;
count means for counting the number of pulses of the clock signal outputted from the gate means and for outputting a count value;
first detection means for outputting the operation end signal when detecting that the count value becomes a predetermined first set value; and
second detection means for outputting a start signal when detecting that the count value becomes a second set value lower than the first set value.

2. A clock control circuit according to claim 1, wherein
the count means includes a counter which counts the clock signal when the gate signal is given, and is reset when the gate signal is released;
the first detection means includes a first register for setting the first set value, and a first comparator for outputting the operation end signal when the count value of the counter coincides with the value of the first register; and
the second detection means includes a second register for setting the second set value and a second comparator for outputting the starting signal when the count value of the counter coincides with the value of the second register.

3. A clock control circuit including a plurality of clock control portions which are provided correspondingly to a plurality of functional blocks, wherein the plurality of functional blocks each perform a logical operation in accordance with a specific sequence based on a master clock signal, the clock control portions each supplying a reference clock signal as a basis of the logical operations, each of the clock control portions comprising:
a gate controller that outputs a gate signal based on an external starting signal that is externally provided or provided from another clock control portion, and that stops output of the gate signal based on an operation end signal;
a gate that receives the master clock signal and the gate signal, and that outputs the reference clock signal to a corresponding functional block responsive to the gate signal;
a counter that counts a number of pulses of the reference clock signal output from the gate and that outputs a count value;

a first detector that outputs the operation end signal upon detecting that the count value equals a first value; and a second detector that outputs a start signal upon detecting that the count value equals a second value lower than the first value.

4. The clock control signal of claim 3, wherein the gate controller comprises:

a control circuit that receives the external starting signal and provides a first control signal based on the master clock signal, and that receives the operation end signal and provides a second control signal based on the reference clock signal; and a logic gate that outputs the gate signal responsive to the first and second control signals.

5. The clock control circuit of claim 4, wherein the control circuit is disabled responsive to receipt of a power save mode signal, to prevent the gate controller from outputting the gate signal.

6. The clock control circuit of claim 4, wherein the control circuit comprises:

a first flip-flop having the external starting signal input thereto and being clocked by the master clock signal, that provides the first control signal; and a second flip-flop having the operation end signal input thereto and being clocked by the reference clock signal, that provides the second control signal.

7. The clock control circuit of claim 4, wherein the logic gate is an OR gate.

8. The clock control circuit according to claim 3, wherein the counter counts the reference clock signal responsive to receipt of the gate signal and is reset responsive to release of the gate signal, the first detector includes a first register that sets the first value, and a first comparator that outputs the operation end signal when the count value of the counter equals the first value set by the first register, and the second detector includes a second register that sets the second value, and a second comparator that outputs the starting signal when the count value of the counter equals the second value set by the second register.

9. The clock control circuit of claim 3, wherein the gate controller disables output of the gate signal during a power save mode.

10. The clock control circuit of claim 3, wherein the gate is an AND gate.

11. A clock control circuit comprising:

a gate controller that outputs a gate signal responsive to an external start signal and that stops output of the gate signal responsive to an operation end signal;

a gate that receives a first clock signal and that outputs a second clock signal responsive to the gate signal;

a counter that counts pulses of the second clock signal and that outputs a count value; and a detector that outputs the operation end signal upon determination that the count value is equal to a first value and that outputs a start signal upon determination that the count value equals a second value, the first value being greater than the second value.

12. The clock control circuit of claim 11, wherein the gate controller comprises:

a control circuit that receives the external start signal and provides a first control signal based on the first clock signal, and that receives the operation end signal and provides a second control signal based on the second clock signal; and a logic gate that outputs the gate signal responsive to the first and second control signals.

13. The clock control circuit of claim 12, wherein the control circuit is disabled responsive to receipt of a power save mode signal, to prevent the gate controller from outputting the gate signal.

14. The clock control circuit of claim 12, wherein the control circuit comprises:

a first flip-flop having the external start signal input thereto and being clocked by the first clock signal, that provides the first control signal; and a second flip-flop having the operation end signal input thereto and being clocked by the second clock signal, that provides the second control signal.

15. The clock control circuit of claim 12, wherein the logic gate is an OR gate.

16. The clock control circuit of claim 11, wherein the counter counts the pulse of the second clock signal responsive to the gate signal and is reset upon release of the gate signal.

17. The clock control circuit of claim 11, wherein the detector comprises:

a first register that has the first value set therein;

a first comparator that outputs the operation end signal when the count value equals the first value set in the first register;

a second register that has the second value set therein; and a second comparator that outputs the start signal when the count value equals the second value set in the second register.

18. The clock control circuit of claim 11, wherein the gate controller disables output of the gate signal during a power save mode.

19. The clock control circuit of claim 11, wherein the gate is an AND gate.

* * * * *